(12) United States Patent
Tanaka et al.

(10) Patent No.: US 8,901,002 B2
(45) Date of Patent: *Dec. 2, 2014

(54) POLISHING SLURRY FOR METAL FILMS AND POLISHING METHOD

(71) Applicant: Hitachi Chemical Co., Ltd., Tokyo (JP)

(72) Inventors: Takaaki Tanaka, Kokubunji (JP); Masato Fukasawa, Hitachi (JP); Shigeru Nobe, Hitachi (JP); Takafumi Sakurada, Hitachi (JP); Takashi Shinoda, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/079,152

(22) Filed: Nov. 13, 2013

(65) Prior Publication Data

US 2014/0065826 A1 Mar. 6, 2014

Related U.S. Application Data

(62) Division of application No. 12/667,154, filed as application No. PCT/JP2008/062159 on Jul. 4, 2008, now Pat. No. 8,609,541.

(30) Foreign Application Priority Data

Jul. 5, 2007 (JP) ................................. 2007-177182

(51) Int. Cl.
 *H01L 21/302* (2006.01)
 *H01L 21/461* (2006.01)
 *H01L 21/768* (2006.01)
 *H01L 21/321* (2006.01)
 *C09G 1/02* (2006.01)

(52) U.S. Cl.
 CPC ...... *H01L 21/7684* (2013.01); *H01L 21/76819* (2013.01); *H01L 21/3212* (2013.01); *C09G 1/02* (2013.01)
 USPC .......................................... 438/690; 438/692

(58) Field of Classification Search
 None
 See application file for complete search history.

(56) References Cited

U.S. PATENT DOCUMENTS

| 4,944,836 A | 7/1990 | Beyer et al. |
| 4,954,142 A | 9/1990 | Carr et al. |

(Continued)

FOREIGN PATENT DOCUMENTS

| CN | 1317742 A | 3/2005 |
| CN | 1590487 A | 3/2005 |

(Continued)

OTHER PUBLICATIONS

F. B. Kaufman et al, "Chemical-Mechanical Polishing for Fabricating Patterned W Metal Features as Chip Interconnects", Journal of the Electrochemical Society, Nov. 1991, pp. 3460-3464, vol. 138, No. 11.

(Continued)

*Primary Examiner* — Duy Deo
(74) *Attorney, Agent, or Firm* — Westerman, Hattori, Daniels & Adrian, LLP (57) ABSTRACT

Provided are a polishing slurry for metal films and a polishing method which restrain the generation of erosion and seams, and makes the flatness of a surface polished therewith or thereby high. The slurry and the method are a polishing slurry, for metal films, comprising abrasive grains, a methacrylic acid based polymer and water, and a polishing method using the slurry, respectively.

20 Claims, 3 Drawing Sheets

(56) References Cited

U.S. PATENT DOCUMENTS

| | | | |
|---|---|---|---|
| 5,770,095 | A | 6/1998 | Sasaki et al. |
| 7,086,935 | B2 * | 8/2006 | Wang ........................ 451/41 |
| 7,300,603 | B2 | 11/2007 | Liu |
| 8,435,896 | B2 * | 5/2013 | Lakrout et al. ............ 438/689 |
| 8,609,541 | B2 * | 12/2013 | Tanaka et al. ............ 438/690 |
| 2005/0029491 | A1 | 2/2005 | Liu |
| 2006/0000151 | A1 | 1/2006 | Kelley et al. |
| 2006/0037251 | A1 | 2/2006 | Kurata et al. |
| 2008/0105652 | A1 | 5/2008 | Brusic et al. |
| 2010/0093585 | A1 | 4/2010 | Kurashima et al. |

FOREIGN PATENT DOCUMENTS

| | | |
|---|---|---|
| CN | 1715311 A | 1/2006 |
| JP | 2-278822 A | 11/1990 |
| JP | 8-83780 A | 3/1996 |
| JP | 2004-319759 A | 11/2004 |
| JP | 2005-064285 A | 3/2005 |
| JP | 2005-123577 A | 5/2005 |
| JP | 2007-165566 A | 6/2007 |
| TW | 200720382 A | 6/2007 |
| WO | 01/13417 A1 | 2/2001 |

OTHER PUBLICATIONS

International Search Report of PCT/JP2008/062159, mailing date of Sep. 30, 2008.
Notification of Transmittal of Translation of the International Preliminary Report om Patentability (Form PCT/IB/338) of Internation Application No. PCT/JP2008/062159 mailed Feb. 4, 2010 with Forms PCT/IB/373 and PCT/ISA/237.
Chinese Office Action dated Feb. 23, 2012, issued in corresponding Chinese Patent Application No. 200880023332.4 w/English translation.
Korean Office Action dated Feb. 24, 2012, issued in corresponding Korean Patent Application No. 10-2010-7000003 w/English translation.
Japanese Notification of Reasons for Refusal dated Aug. 21, 2012, issued in corresponding Japanese patent application No. 2009-521676, w/ English translation.
Taiwanese Office Action dated Aug. 16, 2012, issued in corresponding Taiwanese patent application No. 097125220, w/ English translation.
Chinese Office Action dated Sep. 18, 2012, issued in corresponding Chinese Patent Application No. 200880023332.4, with English translation (13 pages).
Taiwanese Office Action dated Dec. 4, 2012, issued in corresponding Taiwanese patent application No. 097125220, w/ English translation.
Korean Office Action dated Mar. 25, 2013, issued in corresponding Korean Patent Application No. 10-2010-7000003, with English translation (13 pages).
Chinese Office action dated May 3, 2013, issued in Chinese application No. 2011102080596, w/ English translation.
Korean Office Action dated Jul. 17, 2013, issued in corresponding Korean Application No. 10-2013-7013121, w/ English translation.
Chinese Office Action dated Feb. 22, 2011, issued in corresponding Chinese Patent Application No. 2008800233324 w/English translation.
Office Action dated May 27, 2014, issued in corresponding Chinese Patent Application No. 2011102080596, with English Translation (20 pages).

* cited by examiner

POLISHING SLURRY FOR METAL FILMS AND POLISHING METHOD

CROSS-REFERENCE TO RELATED APPLICATIONS

This application is a divisional of U.S. application Ser. No. 12/667,154, filed on Dec. 29, 2009 which is based upon and claims the benefit of priority from the prior Japanese Patent Application No. 2007-177182, filed on Jul. 5, 2007, the entire contents of which are incorporated herein by reference.

TECHNICAL FIELD

The present invention relates to a polishing slurry for metal films and a polishing method that are used for polishing in the step of forming wiring of a semiconductor device, or some other step.

BACKGROUND ART

In recent years, new fine processing technologies have been developed as the integration degree of semiconductor integrated circuits (hereinafter referred to as LSIs) and the performance thereof have been becoming high. Chemical mechanical polishing (hereinafter referred to as CMP) is also one of the technologies, and is a technique used frequently in the process of producing LSIs, in particular, in the planarization of an interlayer dielectric, the formation of metal plugs, or the formation of embedded interconnections (wiring) in a multilayer interconnection forming step. This technique is disclosed in, for example, the specification of U.S. Pat. No. 4,944,836.

In order to make the performance of LSIs high, attempts of making use of copper or copper alloy as an electroconductive material which is to be a wiring material have been recently made. However, copper or copper alloy is not easily subjected to fine processing based on dry etching, which is frequently used to form conventional aluminum alloy wiring.

Thus, the so-called damascene process is mainly adopted, which is a process of depositing a copper or copper alloy thin film on an insulating film in which grooves are beforehand made, so as to embed the thin film therein, and then removing the thin film in any region other than the groove regions by CMP to form embedded wiring. This technique is disclosed in, for example, JP-A No. 2-278822.

An ordinary method of metal CMP for polishing a wiring metal, such as copper or copper alloy, is a method of: causing a polishing pad to adhere onto a circular polishing table (platen); impregnating the surface of the polishing pad with a metal polishing slurry while pushing a metal-film-formed surface of a substrate against the polishing cloth surface; and rotating the polishing table in the state that a predetermined pressure (hereinafter referred to as a polishing pressure) is applied thereto from the rear surface of the polishing pad to the metal film, thereby removing convex regions of the metal film by effect of relative mechanical friction between the polishing slurry and the convex regions of the metal film.

A metal polishing slurry used for metal CMP is generally composed of an oxidizer, abrasive grains, and water. As necessary, an oxidized metal dissolving agent, a protective film forming agent, and others are added thereto. The surface of a metal film is first oxidized with the oxidizer to form an oxidized layer, and the oxidized layer is shaven off the abrasive grains. This is considered to be a basic mechanism. The oxidized layer in concave regions of the metal film surface does not contact the polishing pad very much; thus, the shaving-off effect of the abrasive grains is not given thereto. Therefore, with the advance of CMP, the oxidized layer in convex regions of the metal film is removed so that the substrate surface is planarized. Details thereof are disclosed in Journal of Electrochemical Society, Vol. 138, No. 11 (1991), 3460-3464.

It is mentioned that an effective method for making the polishing rate of CMP high is the addition of an oxidized metal dissolving agent to a polishing slurry for metal films. This can be interpreted as follows: when grains of a metal oxide shaven off with the abrasive grains are dissolved into the polishing slurry (the dissolution will be referred to as etching hereinafter), the shaving-off effect of the abrasive grains increases. The addition of the oxidized metal dissolving agent produces an improvement in the polishing rate of CMP; however, when an oxidized layer in concave regions of a metal film surface is also etched so that the metal film surface is exposed uncovered, the metal film surface is further oxidized with the oxidizer. When this is repeated, the etching of the metal film in the concave regions advances. As a result, there is generated a phenomenon that a central region of the surface of metal wiring embedded after the polishing is gullied like a dish form (hereinafter, the phenomenon will be referred to as "dishing"). Thus, the planarizing effect is damaged.

For prevention thereof, a protective film forming agent is further added to the metal film polishing slurry. The protective film forming agent is an agent for forming a protective film on the oxide layer on the metal film surface to prevent the oxidized layer from being etched. The protective film is desirably removed easily by the abrasive grains without deterioration in CMP polishing rate.

In order to restrain the dishing or etching of a metal film to form LSI wiring high in reliability, suggested is a method using a polishing slurry for metal films, which contains an aminoacetic acid, glycine, or amidesulfuric acid as an oxidized metal dissolving agent, and benzotriazole as a protective film forming agent. This technique is described in, for example, JP-A No. 8-83780.

In the formation of a metal embedment, such as the formation of damascene wiring made of copper, copper alloy or the like, or the formation of plug wiring made of tungsten or the like, the following phenomena are generated when the polishing rate of a silicon dioxide film, which is an interlayer dielectric formed in regions other than the embedded regions, is also large: a phenomenon that the wiring together with the interlayer dielectric becomes thin (hereinafter referred to as erosion), and a phenomenon that the interlayer dielectric near the wiring metal regions is locally eroded out (hereinafter referred to as seams). Thus, the flatness deteriorates. As a result, an increase in the wiring resistance, and other problems are caused. It is therefore required to make the erosion and seams as small as possible.

In the meantime, below the wiring metal such as copper or copper alloy, a layer made of an electric conductor, such as tantalum, tantalum alloy or tantalum nitride, is formed as a barrier conductor layer (hereinafter referred to as a barrier layer) for preventing the diffusion of the metal into the interlayer dielectric and improving the adhesiveness. Accordingly, it is necessary to remove the exposed barrier layer by CMP in regions other than the wiring regions where the wiring metal such as copper or copper alloy is embedded. However, the conductors of the barrier layers are higher in hardness than copper or copper alloy; therefore, a sufficient polishing rate of the conductor is not obtained even with a combination of two or more out of polishing materials for copper or copper alloy, and the flatness of the polished surface becomes poor in many cases. Thus, a two-step polishing method has been investigated, which is composed of a first polishing step of polishing a wiring metal, and a second polishing step of polishing a barrier layer.

Figure 1:
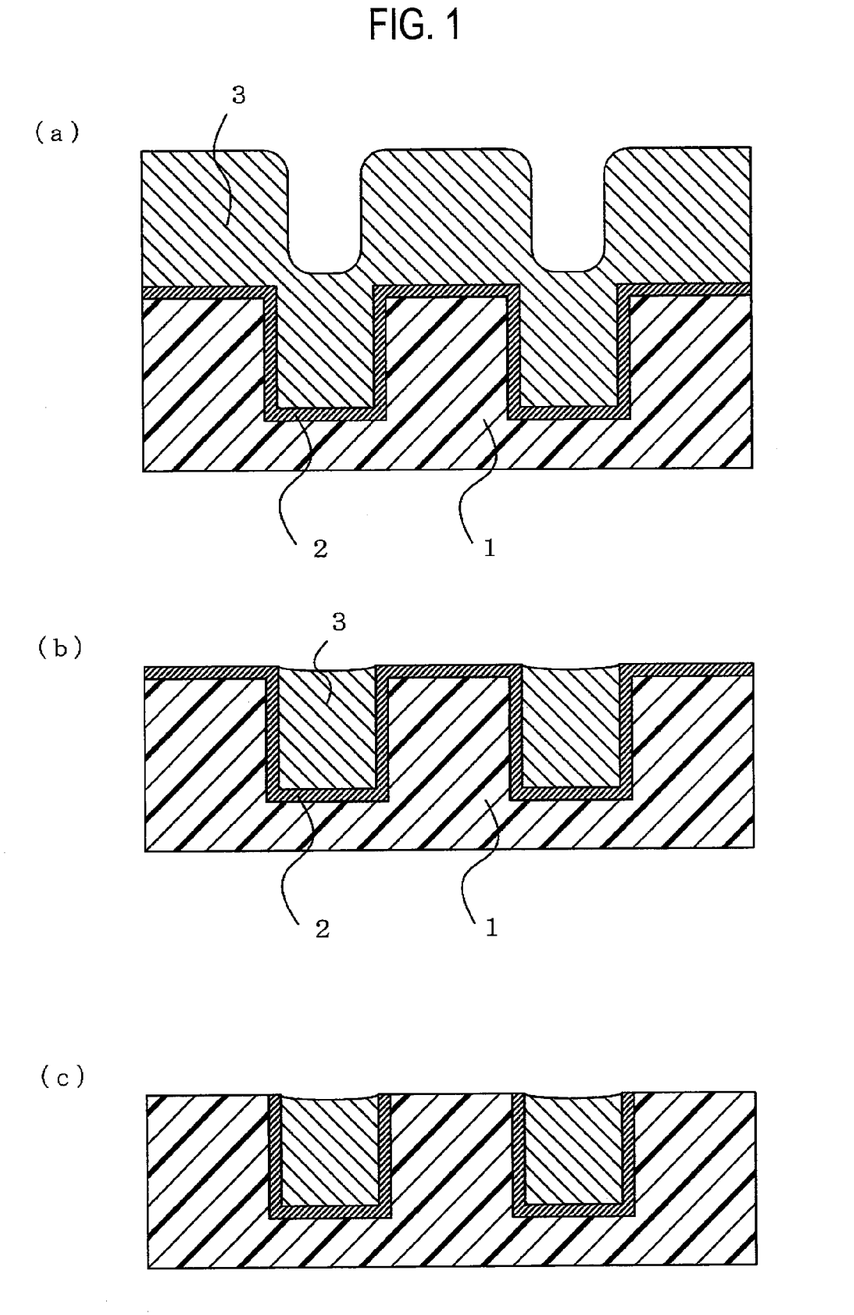
FIG. 1 are schematic sectional views related to the formation of wiring through a damascene process.

FIG. 1 illustrate schematic sectional views illustrating the formation of wiring through an ordinary damascene process. FIG. 1(a) illustrates a state before polishing, and the whole illustrated therein has an interlayer dielectric 1 having a surface in which grooves are made, a barrier layer 2 formed to follow surface concaves and convexes of the interlayer dielectric 1, and a wiring metal 3 made of copper or copper alloy and deposited to be embedded into the concaves and convexes.

As illustrated in FIG. 1(b), the wiring metal 3 is first polished with a polishing liquid for wiring-metal-polishing until the barrier layer 2 becomes exposed. Next, as illustrated in FIG. 1(c), the resultant is polished with a polishing liquid for barrier-layer-polishing until the convex regions of the interlayer dielectric 1 become exposed.

As such a polishing liquid for barrier-layer-polishing, suggested is a polishing liquid for chemical mechanical polishing which contains an oxidizer, an agent for forming a protective film on a metal surface, an acid and water, and has a pH of 3 or less wherein the concentration of the oxidizer is from 0.01 to 3% by weight (see, for example, the pamphlet of Re-Published Patent WO 01/13417).

About the two-step polishing method, the second polishing step of polishing a barrier layer may be required to have an over-polishing step of polishing the interlayer dielectric excessively in order to make the polished surface flat. An example of the interlayer dielectric is a silicon dioxide film, an organosilicate glass film which is low-k (low dielectric constant) film, or a fully-aromatic ring type low-k film. When this interlayer dielectric is over-polished, there is caused erosion, which is a phenomenon that regions where wiring metal pieces are densely arranged are excessively polished as compared with regions other than the excessively-polished regions, so that the thickness of the interlayer dielectric near the wiring metal becomes thin, or seams, wherein the interlayer dielectric near the wiring metal is locally eroded out, in accordance with the composition of the CMP polishing slurry. Thus, the flatness of the polished surface may have deteriorated to cause an increase in the wiring resistance, and other problems.

The inventors have investigated, as a method for decreasing the generation of the erosion or seams, a method using a polishing liquid containing a water-soluble polymer for protecting the surface of a wiring metal, for example, copper, and then found out that this method makes it possible to decrease the generation of the erosion or seams. However, on the other hand, the water-soluble polymer is combined with copper, which is a wiring metal, to form a copper complex on the substrate after the second polishing step, and this copper complex is adsorbed on the substrate so as to be turned to an organic residue so that the substrate is contaminated therewith. Moreover, by effect of the water-soluble polymer, the abrasive grains may be aggregated so that scratches may be generated in the polished surface of the substrate to deteriorate the flatness. When these defects are generated, inconveniences such as a short circuit, a disconnection, a fall in the yield and a fall in the reliability, are generated in the production of a high-performance semiconductor device, wherein the formation of fine wiring is necessary and indispensable.

An object of the invention is to provide a polishing slurry for metal films and a polishing method which restrain erosion and seams from being generated while a good rate of polishing an interlayer dielectric is maintained, thereby making the flatness of a surface polished therewith or thereby high.

Another object of the invention is to provide a polishing slurry for metal films and a polishing method which can restrain the generation of a scratch or the generation of an organic residue on a substrate polished therewith or thereby.

DISCLOSURE OF THE INVENTION

The inventors have acquired an idea that in order to decrease the generation of the erosion or seams, it is effective to use an additive that has high adsorbability onto copper, which is a wiring metal, and have found out that this can be attained by use of a specific polymer as the additive.

Accordingly, the present invention relates to (1) a polishing slurry for metal films, comprising abrasive grains, a methacrylic acid based polymer, and water.

The present invention also relates to (2) the polishing slurry for metal films according to the item (1), wherein the methacrylic acid based polymer is at least one selected from a homopolymer made from a methacrylic acid, and a copolymer made from methacrylic acid and a monomer copolymerizable with the methacrylic acid.

The present invention also relates to (3) the polishing slurry for metal films according to the item (1) or (2), wherein the species of the abrasive grains is at least one selected from silica, alumina, ceria, titania, zirconia, germania, or modified products thereof.

The present invention also relates to (4) the polishing slurry for metal films according to any one of the items (1) to (3), further comprising an organic solvent.

The present invention also relates to (5) the polishing slurry for metal films according to any one of the items (1) to (4), further comprising an oxidized metal dissolving agent.

The present invention also relates to (6) the polishing slurry for metal films according to any one of the items (1) to (4), further comprising an oxidizer for metal.

The present invention also relates to (7) the polishing slurry for metal films according to any one of the items (1) to (6), further comprising an anticorrosive agent for a metal.

The present invention also relates to (8) the polishing slurry for metal films according to any one of the items (1) to (7), which is a polishing slurry for polishing a film to be polished which has, on a surface thereof, a wiring-formed area having a wiring density of 50% or more.

The present invention also relates to (9) a polishing method, characterized by including:

a first polishing step of polishing an electroconductive material layer of a substrate having an interlayer dielectric having a surface comprising concave regions and convex regions, a barrier layer for covering the interlayer dielectric along the surface thereof, and the electroconductive material layer filled into the concave regions so as to cover the barrier layer, thereby making the barrier layer over the convex regions exposed; and a second polishing step of exposing the interlayer dielectric over the convex regions by polishing the barrier layer exposed in the first polishing step by using the polishing slurry for metal films according to any one of the items 1 to 8.

The present invention also relates to (10) the polishing method according to the item (9), wherein the interlayer dielectric is a silicon-based coating film, or an organic polymer film.

The present invention also relates to (11) the polishing method according to the item (9) or (10), wherein the electroconductive material is made mainly of copper.

The present invention also relates to (12) the polishing method according to any one of the items (9) to (11), wherein the barrier layer comprises at least one selected from tantalum, tantalum compounds, titanium, titanium compounds, tungsten, tungsten compounds, ruthenium, and ruthenium compounds.

According to the present invention, the incorporation of a methacrylic acid based polymer makes it possible to provide a polishing shiny for metal films and a polishing method which restrain erosion and seams from being generated while a good rate of polishing an interlayer dielectric is maintained, thereby making the flatness of a surface polished therewith or thereby high.

According to the present invention, the selection of an optimal polymer out of species of the methacrylic acid based polymer makes it possible to provide a polishing slurry for metal films and a polishing method which can restrain the generation of a scratch or the generation of an organic residue on a substrate polished therewith or thereby as well as the above-mentioned advantageous effect is produced.

According to the present invention, the incorporation of abrasive grains, an oxidizer for metal, an anticorrosive agent for a metal, and so on makes it possible to give a good rate of polishing a wiring metal and a barrier metal as well as the above-mentioned advantageous effects are produced. As a result thereof, a polishing slurry for metal films that is suitable for the above-mentioned second polishing step can be obtained.

BEST MODE FOR CARRYING OUT THE INVENTION

The polishing slurry of the present invention for metal films is characterized by containing a methacrylic acid based polymer. The methacrylic acid based polymer is higher in adsorptivity onto copper than other water-soluble polymers, and is particularly high in adsorptivity onto copper in a region where the wiring density is high, so as to give a very good protecting performance. It is therefore presumed that this makes it possible to decrease the generation of erosion or seams when a film to be polished is polished. The methacrylic acid based polymer is preferably at least one selected from a homopolymer made from a methacrylic acid, and a copolymer made from methacrylic acid and a monomer copolymerizable with the methacrylic acid.

When the methacrylic acid based polymer is a copolymer made from methacrylic acid and a monomer copolymerizable with the methacrylic acid, the ratio of the amount of methacrylic acid to the total amount of the monomers is preferably 40% or more by mole and less than 100% by mole, more preferably 50% or more by mole and less than 100% by mole, even more preferably 60% or more and less than 100% by mole, in particular preferably 70% or more and less than 100% by mole. When the ratio of the amount of methacrylic acid is set to 40% or more by mole, the generation of erosion and seams is effectively restrained so that the flatness of a surface to be polished is easily made high.

The weight-average molecular weight of the methacrylic acid based polymer is preferably 3000 or more, more preferably 5000 or more. When the weight-average molecular weight of the methacrylic acid based polymer is set to 3000 or more, the generation of erosion and seams is effectively restrained so that the flatness of a surface to be polished is easily made high. The upper limit of the weight-average molecular weight is not particularly limited, and is preferably 5000000 or less from the viewpoint of the solubility thereof. From the viewpoint of the easiness of the synthesis, the easiness of the control of the molecular weight, and others, the weight-average molecular weight is preferably 1000000 or less. The molecular weight is more preferably 100000 or less since the solubility in water is very good so that the flexibility of the addition amount thereof is raised.

The weight-average molecular weight of the methacrylic acid based polymer may be measured by gel permeation chromatography, using a calibration curve of standard polystyrene. Specifically, for example, measuring conditions described below can be given.

Instrument to be used: an HPLC pump (L-7100, manufactured by Hitachi, Ltd.) provided with a differential refractometer (model number: L-3300, manufactured by Hitachi, Ltd.)

Column: SHODEX ASAHIPAK GF-710HQ (product name) manufactured by Showa Denko K.K.

Mobile phase: a mixed liquid of a 50 mM of disodium hydrogen phosphate aqueous solution/acetonitrile (=90/10 (V/V))

Flow rate: 0.6 mL/min

Column temperature: 25° C.

Examples of the monomer copolymerizable with methacrylic acid include:

carboxylic acids such as acrylic acid, crotonic acid, vinylacetic acid, tiglic acid, 2-trifluoromethylacrylic acid, itaconic acid, fumaric acid, maleic acid, citraconic acid, mesaconic acid, and gluconic acid;

sulfonic acids such as 2-acrylamide-2-methylpropanesulfonic acid;

acrylic acid type esters such as methyl acrylate, ethyl acrylate, propyl acrylate, butyl acrylate, 2-ethylhexyl acrylate, methyl methacrylate, ethyl methacrylate, propyl methacrylate, butyl methacrylate, and 2-ethylhexyl methacrylate; and ammonium salts, alkali metal salts and alkylamine salts thereof. When the substrate to which the slurry is applied is a silicon substrate for semiconductor integrated circuits, or the like, it is undesired that the substrate is contaminated with any alkali metal; therefore, the copolymerizable monomer is preferably an acid or ammonium salt thereof. This matter is inapplicable when the substrate is a glass substrate or the like.

As described above, in order to decrease the generation of erosion and seams, it is more effective that the content by percentage of methacrylic acid in the methacrylic acid based polymer is larger. However, when attention is paid to a matter that defects, such as the generation of an organic residue or the generation of scratches, on the surface polished with the polishing slurry of the present invention can be decreased, it is preferred to use, as the methacrylic acid based polymer, a copolymer made from methacrylic acid and a monomer copolymerizable with the methacrylic acid.

The monomer copolymerizable with the methacrylic acid is more preferably acrylic acid, or acrylic acid type esters in light of an advantage that the monomer is effective for the decrease in the defects, and is more preferably acrylic acid and an acrylic acid ester since a balance between the advantage and a decrease in the generation of erosion and seams can be adjusted.

The blend amount of the methacrylic acid based polymer is preferably from 0.001 to 15 g, more preferably from 0.01 to 5 g for 100 g of the total amount of all components of the polishing slurry for metal films. When the blend amount of the methacrylic acid based polymer is set to 0.001 g or more, the generation of erosion and seams is effectively restrained so that the flatness of the surface to be polished is easily made high. When the amount is set to 15 g or less, the generation of erosion and seams is restrained while the stability of the abrasive grains contained in the polishing slurry for metal films is maintained so that the dispersibility of the abrasive grains is made good.

As described above, in order to restrain the generation of erosion and seams effectively, it is preferred for the polishing slurry of the present invention for metal films to satisfy at least one of the following items (1) and (2):

(1) The ratio of the amount of methacrylic acid to the total amount of the monomers constituting the methacrylic acid based polymer is made high.

(2) Acrylic acid or acrylic acid type esters is/are used as the monomer component copolymerizable with methacrylic acid.

It is preferred to satisfy the items (1) and (2) since the generation of erosion and seams is restrained while defects such as scratches and an organic residue can be decreased. In other words, the polymer is preferably a copolymer made from methacrylic acid and acrylic acid, or a copolymer made from methacrylic acid and acrylic acid type esters. The polymer is in particular preferably a copolymer made from methacrylic acid and acrylic acid, or a copolymer made from methacrylic acid and an acrylic acid ester from the viewpoint of a decrease in the generation of erosion and seams. The ratio of the amount of methacrylic acid to the total amount of the monomers constituting the methacrylic acid based polymer is preferably 70% or more by mole and less than 100% by mole, more preferably 80% or more by mole, even more preferably 90% or more by mole. In order to restrain the defects effectively, the ratio of the amount of methacrylic acid to the total amount of the monomers is preferably 99% or less by mole, more preferably 95% or less by mole.

The polishing slurry of the present invention for metal films may be divided into two liquids composed of a slurry containing at least the abrasive grains, and an addition liquid containing at least the methacrylic acid based polymer. This manner makes it possible to avoid a problem, about the stability of the abrasive grains, caused when a large amount of the methacrylic acid based polymer is added. When the polishing slurry is divided into the two liquids, the methacrylic acid based polymer may be contained in the slurry. In this case, the content by percentage of the methacrylic acid based polymer in the slurry is set into a range that does not permit the dispersibility of the abrasive grains to be damaged.

In order that the polishing slurry of the present invention for metal films may be used in the second polishing step, it is preferred that the slurry contains abrasive grains, an organic solvent, an oxidized metal dissolving agent, and water. These components will be described in detail hereinafter.

(Abrasive Grains)

The polishing slurry of the invention for metal films preferably contains abrasive grains in order to gain a good rate of polishing a barrier layer and an interlayer dielectric. The species of the abrasive grains that may be used is at least one selected from silica, alumina, zirconia, ceria, titania, germania, or modified products thereof. The modified products are each a product wherein the surfaces of the abrasive grain particles of silica, alumina, zirconia, ceria, titania, germania or the like are modified with an alkyl group.

The method for modifying the abrasive grain particle surfaces with an alkyl group is not particularly limited, and may be a method of causing hydroxyl groups present on the abrasive grain particle surfaces to react with an alkoxy silane having the alkyl group. The alkoxy silane having the alkyl group is not particularly limited, and examples thereof include monomethyltrimethoxysilane, dimethyldimethoxysilane, trimethylmonomethoxysilane, monoethyltrimethoxysilane, diethyldimethoxysilane, triethylmonomethoxysilane, monomethyltriethoxysilane, dimethyldiethoxysilane, and trimethylmonoethoxysilane. The method for the reaction is not particularly limited. For example, abrasive grain particles are caused to react with the alkoxysilane in the polishing slurry at room temperature. The system may be heated to accelerate the reaction.

Out of the abrasive grain species, preferred are colloidal silica and colloidal alumina having an average particle diameter of 200 nm or less, which are good in dispersion stability in the polishing slurry and less give the generation number of scratches generated by CMP, and more preferred are colloidal silica and colloidal alumina having an average particle diameter of 100 nm or less.

The particle diameter referred to herein means the secondary particle diameter of the abrasive grains before the grains are incorporated into a polishing slurry. The particle diameter (secondary particle diameter) may be measured by producing a sample wherein the abrasive grains are dispersed in water, and using an optical diffraction scattering type particle size distribution meter. Specifically, for example, a meter COULTER N4SD manufactured by COULTER Electronics Co. is used to make a measurement under the following conditions: measuring temperature: 20° C.; solvent refractive index: 1.333 (water); particle refractive index: unknown (setting); solvent viscosity: 1.005 cp (water); run time: 200 seconds; laser incident angle: 90°; and intensity (scattering intensity corresponding to the turbidity): the intensity should be in the range of 5E+04 to 4E+05. When the intensity is higher than 4E+05, the sample is diluted with water and then the diluted sample is permitted to be measured. Colloidal particles are usually obtained in the state that the particles are dispersed in water; thus, the particle diameter may be measured after the sample is appropriately diluted to set the scattering intensity into the above-mentioned scattering intensity range. For a tentative reference, it is advisable that the sample should be prepared to contain the particles in an amount of 0.5 to 2.0% by mass.

The abrasive grains are preferably grains wherein primary particles are aggregated in such a manner that the average number of the particles aggregated to each other is merely less than 2, more preferably grains wherein primary particles are aggregated in such a manner that the average number of the particles aggregated to each other is merely less than 1.2. The upper limit of the degree of the aggregation is varied in accordance with the primary particle diameter of the used abrasive grains. It would be sufficient for the invention that the secondary particle diameter falls in the above-mentioned range. The aggregation degree can be obtained by gaining the secondary particle diameter and the primary particle diameter and then calculating the ratio therebetween (the secondary particle diameter/the primary particle diameter).

The primary particle diameter may be measured with a known transmission electron microscope (for example, H-7100FA manufactured by Hitachi, Ltd.). For example, the electron microscope is used to take a photograph of an image of particles, and about a give number of particles selected at will from the particles, two-axis average primary particle diameters thereof are calculated out. The average value of these values is then calculated. In the case that the particle diameter distribution is wide, the given number should be rendered a number permitting the average value to become stable. In the case of using colloidal silica or colloidal alumina as the abrasive grains, the number of particles to be measured may be, for example, approximately 20 since the particle diameters are not various in general.

Specifically, induced is a rectangle (circumscribed rectangle) arranged in such a manner that the rectangle is circumscribed to any one of the selected particles and the long diameter thereof is made longest. When the long diameter of the circumscribed rectangle is represented by L and the short diameter thereof is represented by B, the two-axis average primary particle diameter is calculated out as (L+B)/2. This operation is made about the 20 particles arbitrarily selected. The average value of the resultant values is referred to as the two-axis average primary particle diameter ($R_1$) in the present invention. This operation can be made automatic through a computer program.

Simultaneously, the standard deviation of the average particle diameter distribution is preferably 10 nm or less, more preferably 5 nm or less. These may be used alone or in the form of a mixture of two or more thereof. In the method for measuring the particle diameter distribution, the abrasive grains in the polishing slurry are charged into the COULTER N4SD manufactured by COULTER Electronics Co., and then the value of the standard deviation can be obtained from a chart of the particle diameter distribution.

The blend amount of the abrasive grains is preferably from 0.01 to 50 g, more preferably from 0.02 to 30 g, in particular preferably from 0.05 to 20 g for 100 g of the total amount of all the components of the polishing slurry for metal films. When the blend amount of the abrasive grains is set to 0.01 g or more, the polishing rate is made good. When the amount is set to 50 g or less, the generation of scratches is easily restrained.

(Organic Solvent)

The polishing slurry of the present invention for metal films preferably contains an organic solvent since the wettability of the polishing slurry for metal films to a substrate can be improved and a good polishing rate can be obtained also at the time of using an organic film as an interlayer dielectric. The organic solvent used in the present invention is not particularly limited, and is preferably a solvent that can be mixed with water at any ratio. Examples thereof include:

carbonates, such as ethylene carbonate, propylene carbonate, dimethyl carbonate, diethyl carbonate, and methyl ethyl carbonate;

lactones, such as butyrolactone, and propiolactone;

glycols, such as ethylene glycol, propylene glycol, diethylene glycol, dipropylene glycol, triethylene glycol, and tripropylene glycol;

glycol derivatives, for example, glycol monoethers, such as ethylene glycol monomethyl ether, propylene glycol monomethyl ether, diethylene glycol monomethyl ether, dipropylene glycol monomethyl ether, triethylene glycol monomethyl ether, tripropylene glycol monomethyl ether, ethylene glycol monoethyl ether, propylene glycol monoethyl ether, diethylene glycol monoethyl ether, dipropylene glycol monoethyl ether, triethylene glycol monoethyl ether, tripropylene glycol monoethyl ether, ethylene glycol monopropyl ether, propylene glycol monopropyl ether, diethylene glycol monopropyl ether, dipropylene glycol monopropyl ether, triethylene glycol monopropyl ether, tripropylene glycol monopropyl ether, ethylene glycol monobutyl ether, propylene glycol monobutyl ether, diethylene glycol monobutyl ether, dipropylene glycol monobutyl ether, triethylene glycol monobutyl ether, and tripropylene glycol monobutyl ether;

and glycol diethers, such as ethylene glycol dimethyl ether, propylene glycol dimethyl ether, diethylene glycol dimethyl ether, dipropylene glycol dimethyl ether, triethylene glycol dimethyl ether, tripropylene glycol dimethyl ether, ethylene glycol diethyl ether, propylene glycol diethyl ether, diethylene glycol diethyl ether, dipropylene glycol diethyl ether, triethylene glycol diethyl ether, tripropylene glycol diethyl ether, ethylene glycol dipropyl ether, propylene glycol dipropyl ether, diethylene glycol dipropyl ether, dipropylene glycol dipropyl ether, triethylene glycol dipropyl ether, tripropylene glycol dipropyl ether, ethylene glycol dibutyl ether, propylene glycol dibutyl ether, diethylene glycol dibutyl ether, dipropylene glycol dibutyl ether, triethylene glycol dibutyl ether, and tripropylene glycol dibutyl ether;

ethers, such as tetrahydrofuran, dioxane, dimethoxyethane, polyethylene oxide, ethylene glycol monomethyl acetate, diethylene glycol monoethyl ether acetate, and propylene glycol monomethyl ether acetate;

alcohols, such as methanol, ethanol, propanol, n-butanol, n-pentanol, n-hexanol, and isopropanol;

ketones, such as acetone, and methyl ethyl ketone; and others, such as phenol, dimethylformamide, n-methylpyrrolidone, ethyl acetate, ethyl lactate, and sulfolane. The organic solvent is preferably at least one selected from glycol monoethers, alcohols, and carbonates.

The blend amount of the organic solvent is preferably from 0.1 to 95 g, more preferably from 0.2 to 50 g, in particular preferably from 0.5 to 10 g for 100 g of the total amount of all the components of the polishing slurry for metal films. When the blend amount of the organic solvent is set to 0.1 g or more, the wettability of the polishing slurry for metal films to a substrate becomes good. When the amount is set to 95 g or less, the volatilization of the solvent is decreased so that the safety of the production process is certainly kept with ease.

(Oxidized Metal Dissolving Agent)

The polishing slurry of the present invention for metal films preferably contains an oxidized metal dissolving agent since the dissolution of a wiring metal and a barrier metal oxidized with an oxidizer is promoted so that the polishing rates thereof can be improved. The oxidized metal dissolving agent used in the present invention is not particularly limited as far as the agent can cause an oxidized barrier metal or wiring metal to be dissolved in water. Examples thereof include organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and p-toluenesulfonic acid; and esters of these organic acid, and ammonium salts of these organic acids. Other examples thereof include inorganic acids such as hydrochloric acid, sulfuric acid, and nitric acids; and ammonium salts of these inorganic acids, such as ammonium persulfate, ammonium nitrate, and ammonium chloride, and ammonium chromate. Of these examples, the oxidized metal dissolving agent is preferably at least one selected from formic acid, malonic acid, malic acid, tartaric acid, citric acid, salicylic acid, and adipic acid since the etching rate can be effectively restrained while a practical polishing rate is maintained. These may be used alone or in the form of a mixture of two or more thereof.

The blend amount of the oxidized metal dissolving agent is preferably from 0.001 to 20 g, more preferably from 0.002 to 10 g, in particular preferably from 0.005 to 5 g for 100 g of the total of all the components of the polishing slurry for metal films. When the blend amount of the oxidized metal dissolving agent is set to 0.001 g or more, the polishing rate of a wiring metal and a barrier metal is made good. When the amount is set to 20 g or less, the etching is restrained so that the roughness of the polished surface is easily decreased.

The blend amount of the water may be the balance. The amount is not particularly limited as far as water is contained.

The polishing slurry of the present invention for metal films may contain an oxidizer for metal. Examples of the oxidizer for metal include hydrogen peroxide, nitric acid, potassium periodate, hypochlorous acid, and ozone water. Of these examples, hydrogen peroxide is particularly preferred. These may be used alone, or in the form of a mixture of two or more thereof. When the substrate is a silicon substrate containing elements for integrated circuits, it is undesired that the substrate is contaminated with an alkali metal, an alkaline earth metal, a halide, or the like; therefore, the oxidizer is desirably an oxidizer not containing any nonvolatile component. However, about ozone water, the composition thereof is intensely changed with the passage of time. Thus, hydrogen peroxide is the most suitable. However, when the substrate to which the slurry is applied is a glass substrate containing no semiconductor elements, an oxidizer containing a nonvolatile component is allowable.

The blend amount of the oxidizer for metal is preferably from 0.01 to 50 g, more preferably from 0.02 to 30 g, in particular preferably from 0.05 to 15 g for 100 g of the total amount of all the components of the polishing slurry for metal films. When the blend amount of the oxidizer for metal is set to 0.01 g or more, the polishing rate becomes good. When the amount is set to 50 g or less, the roughness of the polished surface is easily decreased.

The polishing slurry of the present invention for metal films may contain an anticorrosive agent for a metal. As the anticorrosive agent for a metal, a material may be selected which can form a protective film for a wiring metal, such as a copper based metal. Specific examples thereof include 2-mercaptobenzothiazole, triazole type anticorrosive agents, such as 1,2,3-triazole, 1,2,4-triazole, 3-amino-1H-1,2,4-trizole, benzotriazole, 1-hydroxybenzotriazole, 1-dihydroxypropylbenzotriazole, 2,3-dicarboxypropylbenzotriazole, 4-hydroxybenzotriazole, 4-carboxyl(-1H-)benzotriazole, 4-carboxyl(-1H)-benzotriazole methyl ester, 4-carboxyl(-1H-)benzotriazole butyl ester, 4-carboxyl(-1H-)benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, and bis[(1-benzotriazolyl)methyl]phosphonic acid. When the wiring metal contains copper, the use of these triazole type anticorrosive agents is preferred since the agents are very good in anticorrosive effect.

Other examples thereof include pyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraminopyrimidine sulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxypyrimidine, 2,4-diaminopyrimidine, 2-acetoamidepyrimidine, 2-aminopyrimidine, 2-methyl-5,7-diphenyl-(1,2,4)triazolo(1,5-a)pyrimidine, 2-methylsulfanyl-5,7-diphenyl-(1,2,4)triazolo(1,5-a)pyrimidine, 2-methylsulfanyl-5,7-diphenyl-4,7-dihydro-(1,2,4)triazolo(1,5-a)pyrimidine, and 4-aminopyrazolo[3,4-d]pyrimidine, which each contain a pyrimidine skeleton. These may be used alone or in the form of a mixture of two or more thereof.

The blend amount of the metal anticorrosive agent is preferably from 0.001 to 10 g, more preferably from 0.005 to 5 g, in particular preferably from 0.01 to 2 g for 100 g of the total amount of all the components of the polishing slurry for metal films. When the blend amount of the anticorrosive agent is set to 0.001 g or more, the etching of a wiring metal is restrained so that the roughness of the polished metal is easily decreased. When the amount is set to 10 g or less, the polishing rates of a wiring metal and a metal for a barrier layer tend to become good.

As described above, the polishing slurry of the present invention for metal films is the most preferably a slurry containing a methacrylic acid based polymer, abrasive grains, an oxidized metal dissolving agent, an anticorrosive agent for a metal, and an oxidizer for metal. When the polishing slurry contains these components, the effect that the generation of erosion and seams is restrained by the methacrylic acid based polymer can be produced to the maximum.

The polishing slurry of the present invention for metal films may be applied to the formation of a wiring layer in a semiconductor device. The slurry may be used in, for example, chemical mechanical polishing (CMP) of a wiring metal layer, a barrier layer and an interlayer dielectric. In the CMP under the same conditions, the polishing rate ratio of the wiring metal layer/the barrier layer/the interlayer dielectric is preferably (0.1-2)/(1)/(0.1-2), more preferably (0.5-1.5)/(1)/(0.5-1.5). The polishing rate ratio may be obtained by comparing the polishing rates of blanket wafers made of the materials of the respective layers, when the wafers are polished respectively.

The interlayer dielectric may be a silicon based coating film, or an organic polymer film. Examples of the silicon based coating film include silica based coating films, such as silicon dioxide, fluorosilicate glass, an organosilicate glass obtained from trimethylsilane or dimethoxydimethylsilane as a starting material, silicon oxynitride, and hydrogenated silsesquioxane; silicon carbide; and silicon nitride. The organic polymer film may be a fully aromatic low-dielectric-constant interlayer dielectric. The organosilicate glass is particularly preferred. These films are each formed by CVD, spray coating, dip coating or spraying. A specific example of the interlayer dielectric is an interlayer dielectric in a process for producing an LSI, in particular, in a step for forming multi level interconnections.

For the wiring metal, an electroconductive material may be used. The electroconductive material may be a substance made mainly of a metal, such as copper, copper alloy, an oxide of copper, an oxide of copper alloy, tungsten, tungsten alloy, silver or gold, and is preferably a substance made mainly of copper, such as copper, copper alloy, an oxide of copper, or an oxide of copper alloy. The wiring metal layer may be a film by forming the above-mentioned substance into a film form by a known sputtering or plating method.

The barrier layer is formed to prevent the diffusion of the electroconductive material into the interlayer dielectric, and improve the adhesiveness between the interlayer dielectric and the electroconductive material. The composition of the barrier layer is preferably selected from tungsten compounds such as tungsten, tungsten nitride, tungsten alloy, titanium compounds such as titanium, titanium nitride, titanium alloy, tantalum compounds such as tantalum, tantalum nitride, tantalum alloy, ruthenium, and ruthenium compounds. The barrier layer may have a monolayered structure made of one of these substances, or a bilayered structure composed of two or more thereof.

The polishing slurry of the present invention for metal films can be preferably used in the case of polishing a film to be polished which has a wiring-formed area having a wiring density of 50% or more. The wiring density referred to herein is a value calculated from the width of the interlayer dielectric regions and that of the wiring metal regions (including the barrier metal) in the area where the wiring is formed. In a case where their lines and spaces are each, for example, 100 μm in width and 100 μm in width, respectively, the wiring density of the area is 50%.

When the wiring density is 50% or more, the area occupied by the wiring metal regions becomes large; thus, problems of erosion and seams tend to become remarkable in the area. However, when the polishing slurry of the present invention for metal films is used to make a polish, these problems can be decreased. The polishing slurry of the present invention for metal films can be preferably used also in the case of polishing a film to be polished which has a wiring-formed area having a wiring density of 80% or more.

When a polish is made with a polishing cloth, the machine for the polish may be an ordinary polishing machine having a holder for holding a substrate to be polished, and a platen or polishing table to which a motor, the rotation number of which is variable, and others are connected and to which the polishing cloth is attached. The polishing cloth may be an ordinary nonwoven cloth, a polyurethane foam, a porous fluorine-contained resin, or the like, and is not particularly limited.

Conditions for the polishing are not limited, and the rotational speed of the platen is preferably as low as 200 rpm or less so as for the substrate not to be spun out. The pushing pressure of the semiconductor substrate, which has a surface to be polished, onto the polishing cloth is preferably from 1 to 100 kPa. In order that the evenness of the polishing speed in the surface to be polished and the flatness of the pattern can be satisfied, the pressure is more preferably from 5 to 50 kPa. When the surface is polished, the polishing slurry of the present invention for metal films is continuously supplied to the polishing cloth by means of a pump or the like. The amount of the supply is not limited, and is preferably an amount permitting the surface of the polishing cloth to be constantly covered with the polishing slurry.

After the polishing, it is preferred that the substrate is sufficiently washed with running water, a spin drier or the like is then used to clear away water droplets adhering onto the substrate, and subsequently the substrate is dried.

In order to conduct chemical mechanical polishing in the state that the surface state of the polishing cloth is constantly made the same, it is preferred to perform the step of conditioning the polishing cloth before the polishing. For example, a dresser to which diamond particles are attached is used to condition the polishing cloth with a liquid containing at least water. Subsequently, the polishing method of the present invention is performed. A further step of washing the substrate is preferably conducted.

The polishing method of the present invention is characterized by including a first polishing step of preparing a substrate having an interlayer dielectric having a surface containing concave regions and convex regions, a barrier layer for covering the interlayer dielectric along the surface thereof, and an electroconductive material layer (wiring metal layer) filled into the concave regions so as to cover the barrier layer, and polishing the electroconductive material layer of the substrate, thereby making the barrier layer over the convex regions exposed, and a second polishing step of using a polishing slurry of the present invention for metal films to polish the barrier layer, which is made exposed in the first polishing step, thereby making the interlayer dielectric over the convex regions exposed. The polishing method of the present invention may be applied to, for example, the formation of a wiring layer in a semiconductor device.

The following will describe an embodiment of the polishing method of the present invention along the formation of a wiring layer in a semiconductor device.

First, an interlayer dielectric made of silicon dioxide or the like is laminated on a substrate of silicon. Next, concave regions (exposed substrate regions) having a predetermined pattern are formed in the surface of the interlayer dielectric in a known manner, such as the formation of a resist layer and etching, so as to cause the interlayer dielectric to have convex regions and the concave regions. A barrier layer of tantalum or the like is formed by vapor deposition, CVD or the like to cover the interlayer dielectric along the convexes and the concaves in the surface.

Furthermore, an electroconductive material layer of copper or the like for covering the barrier layer is formed by vapor deposition, plating, CVD or the like so as to be filled into the concave regions. It is preferred that the thickness of the interlayer dielectric formed on the substrate, that of the barrier layer, and that of the electroconductive material layer are from about 0.01 to 2.0 μm, from about 0.01 to 2.5 μm, and from about 0.01 to 2.5 μm, respectively. By way of these steps, a substrate having a structure as illustrated in FIG. 1($a$) can be yielded.

Next, for example, a polishing slurry, for electroconductive material, which has a sufficiently large polishing rate ratio of the electroconductive material layer to the barrier layer is used to polish the electroconductive material layer in the surface of the substrate by CMP (first polishing step). This manner gives a desired electric conductor pattern wherein the barrier layer in the convex regions on the substrate is exposed into the surface and the electroconductive material layer is caused to remain in the concave regions, as illustrated in FIG. 1($b$). When this polishing advances, the barrier layer in the convex regions may be partially polished together with the electroconductive material layer. By use of the polishing slurry of the present invention for metal films, the patterned surface yielded through the first polishing step can be polished as a surface to be polished for a second polishing step.

In the second polishing step, in the state that the substrate is pushed and pressed onto a polishing cloth, a polishing platen and the substrate are relatively moved while the polishing slurry of the present invention for metal films is supplied into the gap between the polishing cloth and the substrate. In this way, the barrier layer exposed through the first polishing step is polished. According to the polishing slurry of the present invention for metal films, the electroconductive material layer, the barrier layer and the interlayer dielectric can be polished, and in the second polishing step, at least the exposed barrier layer and the electroconductive material layer in the concave regions are polished.

The polishing is ended at the time of yielding a desired pattern wherein the whole of the interlayer dielectric beneath the barrier layer in the convex regions is made exposed, the electroconductive material layer, which is to be a wiring layer, is caused to remain in the concave regions, and the cross sections of the barrier layer are made exposed at the boundaries between the convex regions and the concave regions. This state is shown in FIG. 1($c$).

In order to keep a better flatness certainly at the time of the polishing end, the resultant is over-polished (when the period until the desired pattern is yielded in the second polishing step is, for example, 100 seconds, a matter that an additional polishing is conducted for 50 seconds besides the 100-second polishing is referred to as 50% over-polishing). In this way, the surface may be polished into a depth extending to a part of the interlayer dielectric in the convex regions (not illustrated).

On the metal wiring formed as described above are further formed an interlayer dielectric and a second metal wiring layer. An interlayer dielectric is again formed between pieces of the wiring and on the wiring, and then the surface is polished to make a flat surface over the entire surface of the semiconductor substrate. By repeating this process predetermined times, a semiconductor device having a desired number of wiring layers can be produced.

The polishing slurry of the present invention for metal films may be used not only to polish a metal film formed on a semiconductor substrate as described above but also to polish a substrate of a magnetic head or the like.

EXAMPLES

The present invention will be described in more detail by way of the following examples; however, the present invention is not limited to these examples without departing from the technical conception of the present invention. For example, the kinds of the materials of the polishing slurry and the blend ratio therebetween may be permissible besides those descried in the examples. The composition or the structure of an object to be polished may be a composition and a structure other than those described in the examples.

Examples 1 to 14, and Comparative Examples 1 to 6

Method for Preparing Polishing Slurries

Some of individual components shown in Tables 1 to 3 were mixed with each other to prepare each of polishing slurries, for metal films, of Examples 1 to 14 and Comparative Examples 1 to 6.

In each of copolymers *1 to *5 in Tables 1 to 3, the ratio by mole (% by mole) between monomers therein is as follows:
*1: methacrylic acid/acrylic acid=94/6
*2: methacrylic acid/acrylic acid=73/27
*3: methacrylic acid/methyl methacrylate=90/10
*4: methacrylic acid/butyl acrylate=95/5
*5: methacrylic acid/butyl methacrylate=95/5
(Polishing of Copper Patterned Substrates)

Copper-wiring attached patterned substrates (854 manufactured by ATDF, CMP pattern: an interlayer dielectric made of silicon dioxide and having a thickness of 500 nm) were prepared. A polishing slurry for copper-film-polishing (HS-H635, manufactured by Hitachi Chemical Co., Ltd.) was used to polish the copper film of each of the substrates in regions other than groove regions therein by a known CMP method. In this way, substrates each of which is shown in FIG. 1(b) were yielded, wherein the barrier layer in the convex regions was exposed into the surface to be polished. The substrates were used to evaluate polishing characteristics of the polishing slurries of the invention for metal films. The barrier layer of each of the patterned substrates was a tantalum nitride film having a thickness of 250 Å.

[Polishing Conditions]
Polishing machine: polishing machine for single-side metal film (MIRRA, manufactured by Applied Materials)
Polishing cloth: sueded polishing cloth made of foamed polyurethane
Platen rotation number: 93 rotations/min
Head rotation number: 87 rotations/min
Polishing pressure: 14 kPa
Polishing slurry supply amount: 200 mL/min
<Step of Polishing the Substrates>

The patterned substrates were subjected to chemical mechanical polishing with the polishing slurries for metal films, which were prepared in the above-mentioned method for preparing the polishing slurries, respectively, under the polishing conditions for 60 seconds. This corresponds to the second polishing step. In about 30 seconds, their interlayer dielectric in the convex regions was entirely exposed into the surface to be polished. In the remaining 30 seconds, this exposed interlayer dielectric was polished in the convex regions.

<Step of Washing the Substrates>
A sponge brush (made of a polyvinyl alcohol based resin) was pushed onto the surface to be polished of each of the patterned substrates, which were polished in the above-mentioned step of polishing the substrates. Distilled water was then supplied to the substrate while the substrate and the sponge were rotated. In this way, the substrate was washed for 60 seconds. Next, the sponge brush was removed, and then distilled water was supplied to the surface to be polished of the substrate for 60 seconds. Lastly, the substrate was rotated at a high speed, thereby repelling away the distilled water to dry the substrate. In this way, each patterned substrate used for evaluations described below was yielded.

<Evaluation Items>
About each of the patterned substrates yielded in the step of washing the substrates, the evaluations described in the following items (1) and (2) were made.

Figure 2:
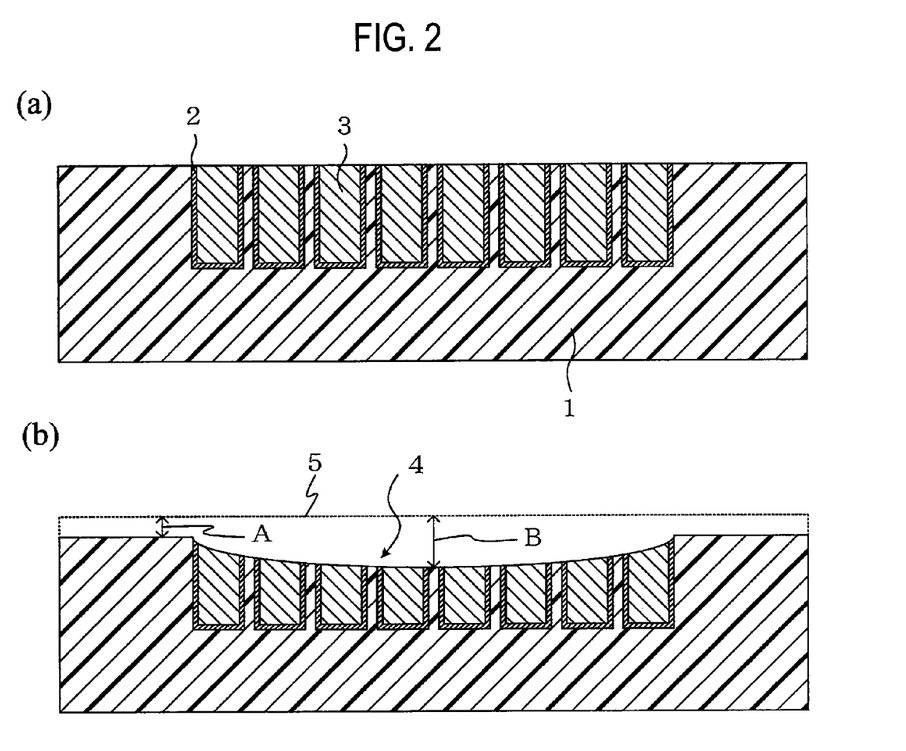
FIG. 2 are schematic sectional views illustrating a stripe-form pattern portion of a copper-wiring attached pattern substrate where wiring metal regions and interlayer dielectric regions are alternately arranged, and an erosion, respectively.

(1) Erosion amount: about each of the patterned substrates yielded in the step of washing the substrates, the surface form of its stripe-form patterned area, the total width of which was 2990 μm, where wiring metal regions 90 μm in width and interlayer dielectric regions 10 μm in width were alternately arranged, was measured with a stylus profilometer, as illustrated in FIG. 2(a). Next, as illustrated in FIG. 2(b), the difference (B)-(A) between the maximum value (B) of the polish amount (polish amount) of the interlayer dielectric in the stripe-form patterned area and the polish amount (A) of the interlayer dielectric regions in the periphery of the stripe-form patterned area, that is, the erosion amount was obtained. This was used as an index for flatness.

Figure 3:
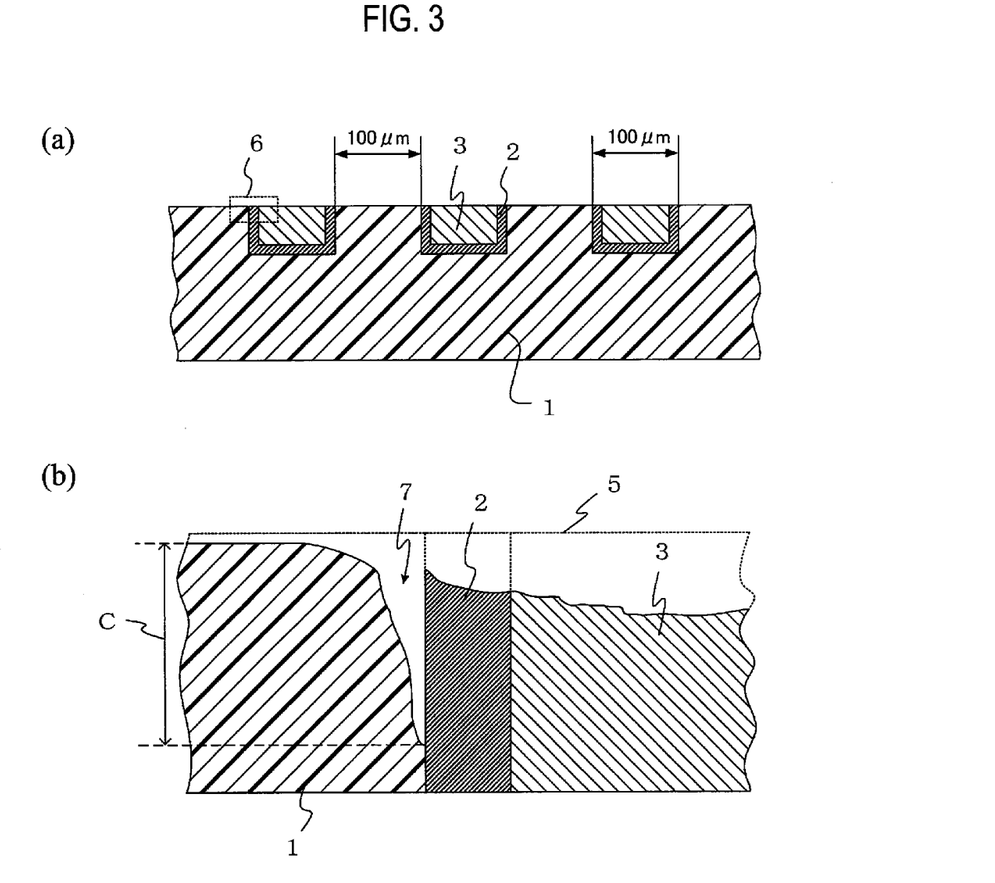
FIG. 3 are schematic sectional views illustrating a portion of a copper-wiring attached pattern substrate where wiring metal regions and interlayer dielectric regions are alternately arranged, and a seam, respectively.

(2) Seam amount: about each of the patterned substrates yielded in the step of washing the substrates, the surface form of its stripe-form patterned area, the total width of which was 2900 μm, where wiring metal regions 100 μm in width and interlayer dielectric regions 100 μm in width were alternately arranged, were measured with a stylus profilometer, as illustrated in FIG. 3(a). Next, as illustrated in FIG. 3(b), the distance (C) from the upper end of the interlayer dielectric in a vicinity 6 of one of the wiring metal regions to the lower end of an excessively-polished interlayer dielectric region, that is, the seam amount was obtained. This was used as an index for flatness.

The film thickness of the interlayer dielectric regions was measured as follows: a copper-wiring attached patterned substrate was used to make a polish; about its stripe-form patterned area, the total width of which was 2900 μm, where wiring metal regions 100 μm in width and interlayer dielectric regions 100 μm in width were alternately arranged, the film thickness of the interlayer dielectric was measured with an optical film thickness meter. The resultant value was used as the polish amount of the interlayer dielectric.

FIG. 2 are each a schematic sectional view of the stripe-form patterned area of the copper-wiring attached patterned substrate, where the wiring metal regions 90 μm in width and the interlayer dielectric regions 10 μm in width were alternately arranged. Reference number 1 represents the interlayer dielectric; 2, the barrier layer; 3, the wiring metal layer; 4, an erosion; 5, a state before the polishing; A, the polish amount of the interlayer dielectric regions in the periphery of the stripe-form patterned area; and B, the maximum value of the polish amount of the interlayer dielectric regions in the stripe-form patterned area.

FIG. 3 are each a schematic sectional view of the area of the copper-wiring attached patterned substrate, where the wiring metal regions 100 μm in width and the interlayer dielectric regions 100 μm in width were alternately arranged. Reference number 1 represents the interlayer dielectric; 2, the barrier layer; 3, the wiring metal layer; 5, a state before the polishing; 6, the wiring metal region vicinity of the interlayer dielectric; 7, a seam; C, the distance from the upper end of the interlayer dielectric region near one of the wiring metal regions to the lower end of the excessively-polished interlayer dielectric region.

(3) Defects: defects on each of the substrates were examined with a defect inspecting device (COMPLUS 3T, manufactured by Applied Materials), and then a length-measurement scanning electron microscope was used to inspect the number of all defects (scratches and organic residues) per $cm^2$. The substrate was then evaluated.

TABLE 1

| | Materials (part by mass) | Examples | | | | | | |
|---|---|---|---|---|---|---|---|---|
| | | 1 | 2 | 3 | 4 | 5 | 6 | 7 |
| Polymers | Polymethacrylic acid (weight-average molecular weight: 8000) | 0.1 | 0.1 | — | — | — | — | — |
| | Polymethacrylic acid (weight-average molecular weight: 21000) | — | — | 0.1 | 0.1 | — | — | — |
| | Methacrylic acid/acrylic acid copolymer *1 (weight-average molecular weight: 8900) | — | — | — | — | 0.1 | 0.1 | — |
| | Methacrylic acid/acrylic acid copolymer *2 (weight-average molecular weight: 8500) | — | — | — | — | — | — | 0.1 |
| | Methacrylic acid/methyl methacrylate copolymer *3 (weight-average molecular weight: 14000) | — | — | — | — | — | — | — |
| | Methacrylic acid/butyl acrylate copolymer *4 (weight-average molecular weight: 13000) | — | — | — | — | — | — | — |
| | Methacrylic acid/butyl methacrylate copolymer *5 (weight-average molecular weight: 12000) | — | — | — | — | — | — | — |
| | Polyacrylic acid (weight-average molecular weight: 59000) | — | — | — | — | — | — | — |
| | Polyvinyl alcohol (weight-average molecular weight: 22000) | — | — | — | — | — | — | — |
| Abrasive grains | Colloidal silica (average particle diameter: 70 nm) | 6 | 6 | 6 | 6 | 6 | 6 | 6 |
| Organic solvents | Isopropyl alcohol | — | — | — | — | — | — | — |
| | Propylene glycol monomethyl ether | — | 2 | — | 2 | — | 5 | — |
| | Propylene glycol monopropyl ether | 5 | — | 5 | — | 8 | — | 8 |
| Oxidized metal dissolving agent | Malic acid | 0.5 | — | 0.5 | — | 0.5 | — | 0.5 |
| | Malonic acid | — | 0.5 | — | 0.5 | — | 0.5 | — |
| Oxidizer | Hydrogen peroxide | 0.5 | 0.5 | 0.5 | 0.5 | 0.5 | 0.5 | 0.5 |
| Anticorrosive agents | Benzotriazole | 0.1 | 0.1 | 0.1 | 0.1 | 0.1 | 0.1 | 0.1 |
| | Triazole | — | 0.1 | — | 0.1 | — | — | — |
| Solvent | Water | 87.8 | 90.7 | 87.8 | 90.7 | 84.8 | 87.7 | 84.8 |
| Patterned substrate | Interlayer dielectric polish amount (Å) | 360 | 380 | 400 | 420 | 390 | 370 | 350 |
| | Erosion amount (Å) | 170 | 200 | 140 | 150 | 180 | 190 | 210 |
| | Seam amount (Å) | 130 | 140 | 100 | 120 | 110 | 100 | 150 |
| | The number of defects | 2~5 | 2~5 | 2~5 | 2~5 | Less than 2 | Less than 2 | Less than 2 |

TABLE 2

| | Materials (part by mass) | Examples | | | | | | |
|---|---|---|---|---|---|---|---|---|
| | | 8 | 9 | 10 | 11 | 12 | 13 | 14 |
| Polymers | Polymethacrylic acid (weight-average molecular weight: 8000) | — | — | — | — | — | — | — |
| | Polymethacrylic acid (weight-average molecular weight: 21000) | — | — | — | — | — | — | — |
| | Methacrylic acid/acrylic acid copolymer *1 (weight-average molecular weight: 8900) | — | — | — | — | — | — | — |
| | Methacrylic acid/acrylic acid copolymer *2 (weight-average molecular weight: 8500) | 0.1 | — | — | — | — | — | — |
| | Methacrylic acid/methyl methacrylate copolymer *3 (weight-average molecular weight: 14000) | — | 0.1 | 0.1 | — | — | — | — |
| | Methacrylic acid/butyl acrylate copolymer *4 (weight-average molecular weight: 13000) | — | — | — | 0.1 | 0.1 | — | — |

TABLE 2-continued

|  | Materials (part by mass) | Examples | | | | | | |
|---|---|---|---|---|---|---|---|---|
|  |  | 8 | 9 | 10 | 11 | 12 | 13 | 14 |
|  | Methacrylic acid/butyl methacrylate copolymer *5 (weight-average molecular weight: 12000) | — | — | — | — | — | 0.1 | 0.1 |
|  | Polyacrylic acid (weight-average molecular weight: 59000) | — | — | — | — | — | — | — |
|  | Polyvinyl alcohol (weight-average molecular weight: 22000) | — | — | — | — | — | — | — |
| Abrasive grains | Colloidal silica (average particle diameter: 70 nm) | 6 | 6 | 6 | 6 | 6 | 6 | 6 |
| Organic solvents | Isopropyl alcohol | — | 3 | 3 | 3 | 3 | — | — |
|  | Propylene glycol monomethyl ether | 5 | — | — | — | — | — | 2 |
|  | Propylene glycol monopropyl ether | — | — | — | — | — | 5 | — |
| Oxidized metal dissolving agent | Malic acid | — | 0.5 | — | 0.5 | — | 0.5 | — |
|  | Malonic acid | 0.5 | — | 0.5 | — | 0.5 | — | 0.5 |
| Oxidizer | Hydrogen peroxide | 0.5 | 0.5 | 0.5 | 0.5 | 0.5 | 0.5 | 0.5 |
| Anticorrosive agents | Benzotriazole | 0.1 | 0.1 | 0.1 | 0.1 | 0.1 | 0.1 | 0.1 |
|  | Triazole | 0.1 | — | 0.1 | — | 0.1 | — | 0.1 |
| Solvent | Water | 87.7 | 89.8 | 89.7 | 89.8 | 89.7 | 87.8 | 90.7 |
| Patterned substrate | Interlayer dielectric polish amount (Å) | 360 | 340 | 360 | 400 | 390 | 380 | 400 |
|  | Erosion amount (Å) | 190 | 260 | 240 | 220 | 220 | 250 | 260 |
|  | Seam amount (Å) | 160 | 150 | 130 | 160 | 180 | 160 | 130 |
|  | The number of defects | Less than 2 | Less than 2 | Less than 2 | Less than 2 | Less than 2 | Less than 2 | Less than 2 |

TABLE 3

|  | Materials (part by mass) | Comparative Examples | | | | | |
|---|---|---|---|---|---|---|---|
|  |  | 1 | 2 | 3 | 4 | 5 | 6 |
| Polymers | Polymethacrylic acid (weight-average molecular weight: 8000) | — | — | — | — | — | — |
|  | Polymethacrylic acid (weight-average molecular weight: 21000) | — | — | — | — | — | — |
|  | Methacrylic acid/acrylic acid copolymer *1 (weight-average molecular weight: 8900) | — | — | — | — | — | — |
|  | Methacrylic acid/acrylic acid copolymer *2 (weight-average molecular weight: 8500) | — | — | — | — | — | — |
|  | Methacrylic acid/methyl methacrylate copolymer *3 (weight-average molecular weight: 14000) | — | — | — | — | — | — |
|  | Methacrylic acid/butyl acrylate copolymer *4 (weight-average molecular weight: 13000) | — | — | — | — | — | — |
|  | Methacrylic acid/butyl methacrylate copolymer *5 (weight-average molecular weight: 12000) | — | — | — | — | — | — |
|  | Polyacrylic acid (weight-average molecular weight: 59000) | — | — | 0.1 | 0.1 | — | — |
|  | Polyvinyl alcohol (weight-average molecular weight: 22000) | — | — | — | — | 0.1 | 0.1 |
| Abrasive grains | Colloidal silica (average particle diameter: 70 nm) | 6 | 6 | 6 | 6 | 6 | 6 |
| Organic solvents | Isopropyl alcohol | — | — | 3 | 3 | — | — |
|  | Propylene glycol monomethyl ether | — | 2 | — | — | — | 5 |
|  | Propylene glycol monopropyl ether | 5 | — | — | — | 8 | — |
| Oxidized metal dissolving agent | Malic acid | 0.5 | — | 0.5 | — | 0.5 | — |
|  | Malonic acid | — | 0.5 | — | 0.5 | — | 0.5 |
| Oxidizer | Hydrogen peroxide | 0.5 | 0.5 | 0.5 | 0.5 | 0.5 | 0.5 |
| Anticorrosive agents | Benzotriazole | 0.1 | 0.1 | 0.1 | 0.1 | 0.1 | 0.1 |
|  | Triazole | — | 0.1 | — | 0.1 | — | 0.1 |
| Solvent | Water | 87.9 | 90.8 | 89.8 | 89.7 | 84.8 | 87.7 |
| Patterned substrate | Interlayer dielectric polish amount (Å) | 390 | 400 | 370 | 360 | 390 | 380 |
|  | Erosion amount (Å) | 600 | 640 | 400 | 420 | 530 | 550 |
|  | Seam amount (Å) | 350 | 380 | 250 | 270 | 300 | 320 |
|  | The number of defects | Less than 2 | Less than 2 | Less than 2 | Less than 2 | Less than 2 | Less than 2 |

In Tables 1 to 3 are shown the evaluation results of the polishing slurries, for metal films, of Examples 1 to 14 and Comparative Examples 1 to 6 when the slurries were used to conduct polishing. In Comparative Examples 1 and 2, into which no polymer is incorporated, erosion is largely generated at a level of 600 to 640 Å, and seams are largely generated at a level of 350 to 380 Å. Thus, the polished surfaces are low in flatness. In Comparative Examples 3 to 6, into which a polymer other than methacrylic acid based polymers is incorporated, the generation of erosion and seams is restrained into a slighter amount than in Comparative Examples 1 and 2. However, the flatness of the polished surfaces is low. On the other hand, in Examples 1 to 14, wherein a polishing slurry of the present invention for metal films is used, erosion and seams are effectively restrained so that the flatness of the polished surfaces is high. In Examples 5 to 14, wherein a copolymer made from methacrylic acid, and acrylic acid or an acrylic acid type esters is used, erosion and seams are restrained into the same degree as in Examples 1 to 4, wherein a homopolymer made from methacrylic acid is used, and further defects are less generated than therein.

The invention claimed is:

1. A polishing method, characterized by including:
a step of preparing a substrate having an interlayer dielectric having a surface comprising concave regions and convex regions, a barrier layer for covering the interlayer dielectric along the surface thereof, and an electroconductive material layer filled into the concave regions so as to cover the barrier layer;
a first polishing step of polishing the electroconductive material layer of the substrate, thereby making the barrier layer over the convex regions exposed; and
a second polishing step of exposing the interlayer dielectric over the convex regions by polishing the barrier layer exposed in the first polishing step by using a polishing slurry for metal films,
the second polishing step comprising an over-polishing step of polishing the interlayer dielectric,
wherein the polishing slurry for metal films comprises abrasive grains, an oxidized metal dissolving agent, a methacrylic acid based polymer, an organic solvent and water,
the methacrylic acid based polymer is at least one selected from the group consisting of a copolymer having a ratio of the amount of methacrylic acid to the total amount of the monomers being 70% or more and less than 100% by mole and a homopolymer made from a methacrylic acid,
the oxidized metal dissolving agent is at least one selected from organic acids, esters of organic acid and ammonium salts of organic acid,
the blend amount of the methacrylic acid based polymer is from 0.001 to 15 g for 100 g of the total amount of all components of the polishing slurry for metal films,
the organic solvent is at least one selected from glycol monoethers, ethers and alcohols, and
the weight-average molecular weight of the methacrylic acid based polymer is 3000 or more and 1000000 or less.

2. The polishing method according to claim 1, wherein the species of the abrasive grains is at least one selected from silica, alumina, ceria, titania, zirconia, germania, or modified products thereof.

3. The polishing method according to claim 1, wherein the polishing slurry for metal films further comprises an oxidizer for metal.

4. The polishing method according to claim 1, wherein the polishing slurry for metal films further comprises an anticorrosive agent for a metal.

5. The polishing method according to claim 1, wherein the interlayer dielectric is a silicon-based coating film or an organic polymer film.

6. The polishing method according to claim 1, wherein the electroconductive material is made mainly of copper.

7. The polishing method according to claim 1, wherein the barrier layer comprises at least one selected from tantalum, tantalum compounds, titanium, titanium compounds, tungsten, tungsten compounds, ruthenium, and ruthenium compounds.

8. A polishing method, characterized by including:
a step of preparing a substrate having a barrier layer and an interlayer dielectric; and
a polishing step of polishing the barrier layer and the interlayer dielectric by using a polishing slurry for metal films, thereby removing a part of the barrier layer and a part of the interlayer dielectric,
wherein the polishing slurry for metal films comprises abrasive grains, an oxidized metal dissolving agent, a methacrylic acid based polymer, an organic solvent and water,
the methacrylic acid based polymer is at least one selected from the group consisting of a copolymer having a ratio of the amount of methacrylic acid to the total amount of the monomers being 70% or more and less than 100% by mole and a homopolymer made from a methacrylic acid,
the oxidized metal dissolving agent is at least one selected from organic acids, esters of organic acid and ammonium salts of organic acid,
the blend amount of the methacrylic acid based polymer is from 0.001 to 15 g for 100 g of the total amount of all components of the polishing slurry for metal films,
the organic solvent is at least one selected from glycol monoethers, ethers and alcohols, and
the weight-average molecular weight of the methacrylic acid based polymer is 3000 or more and 1000000 or less.

9. The polishing method according to claim 8, wherein the species of the abrasive grains is at least one selected from silica, alumina, ceria, titania, zirconia, germania, or modified products thereof.

10. The polishing method according to claim 8, wherein the polishing slurry for metal films further comprises an oxidizer for metal.

11. The polishing method according to claim 8, wherein the polishing slurry for metal films further comprises an anticorrosive agent for a metal.

12. The polishing method according to claim 8, wherein the interlayer dielectric is a silicon-based coating film or an organic polymer film.

13. The polishing method according to claim 8, wherein the barrier layer comprises at least one selected from tantalum, tantalum compounds, titanium, titanium compounds, tungsten, tungsten compounds, ruthenium, and ruthenium compounds.

14. A polishing method, characterized by including:
a step of preparing a substrate having an electroconductive material layer, a barrier layer and an interlayer dielectric; and
a polishing step of polishing the electroconductive material layer, the barrier layer and the interlayer dielectric by using a polishing slurry for metal films, thereby removing a part of the electroconductive material layer, a part of barrier layer and a part of the interlayer dielectric,
wherein the polishing slurry for metal films comprises abrasive grains, an oxidized metal dissolving agent, a methacrylic acid based polymer, an organic solvent and water,
the methacrylic acid based polymer is at least one selected from the group consisting of a copolymer having a ratio of the amount of methacrylic acid to the total amount of the monomers being 70% or more and less than 100% by mole and a homopolymer made from a methacrylic acid,
the oxidized metal dissolving agent is at least one selected from organic acids, esters of organic acid and ammonium salts of organic acid,
the blend amount of the methacrylic acid based polymer is from 0.001 to 15 g for 100 g of the total amount of all components of the polishing slurry for metal films,
the organic solvent is at least one selected from glycol monoethers, ethers and alcohols, and the weight-average molecular weight of the methacrylic acid based polymer is 3000 or more and 1000000 or less.

15. The polishing method according to claim 14, wherein the species of the abrasive grains is at least one selected from silica, alumina, ceria, titania, zirconia, germania, or modified products thereof.

16. The polishing method according to claim 14, wherein the polishing slurry for metal films further comprises an oxidizer for metal.

17. The polishing method according to claim 14, wherein the polishing slurry for metal films further comprises an anti-corrosive agent for a metal.

18. The polishing method according to claim 14, wherein the interlayer dielectric is a silicon-based coating film or an organic polymer film.

19. The polishing method according to claim 14, wherein the electroconductive material is made mainly of copper.

20. The polishing method according to claim 14, wherein the barrier layer comprises at least one selected from tantalum, tantalum compounds, titanium, titanium compounds, tungsten, tungsten compounds, ruthenium, and ruthenium compounds.

* * * * *